(12) United States Patent
Hayashi

(10) Patent No.: US 11,681,090 B2
(45) Date of Patent: Jun. 20, 2023

(54) LIGHT EMITTING MODULE AND METHOD OF MANUFACTURING SAME

(71) Applicant: NICHIA CORPORATION, Anan (JP)

(72) Inventor: Tadao Hayashi, Tokushima (JP)

(73) Assignee: NICHIA CORPORATION, Anan (JP)

(*) Notice: Subject to any disclaimer, the term of this patent is extended or adjusted under 35 U.S.C. 154(b) by 17 days.

(21) Appl. No.: 16/885,254

(22) Filed: May 27, 2020

(65) Prior Publication Data
US 2020/0379165 A1 Dec. 3, 2020

(30) Foreign Application Priority Data

May 30, 2019 (JP) .............................. JP2019-101186
Jan. 31, 2020 (JP) .............................. JP2020-015601

(51) Int. Cl.
| | |
|---|---|
| *G02B 6/00* | (2006.01) |
| *F21V 8/00* | (2006.01) |
| *H01L 33/48* | (2010.01) |
| *H01L 33/50* | (2010.01) |
| *H01L 33/62* | (2010.01) |
| *H01L 33/60* | (2010.01) |

(52) U.S. Cl.
CPC ......... *G02B 6/0091* (2013.01); *G02B 6/0055* (2013.01); *G02B 6/0058* (2013.01); *G02B 6/0065* (2013.01); *G02B 6/0068* (2013.01); *G02B 6/0073* (2013.01); *G02B 6/0083* (2013.01); *H01L 33/486* (2013.01); *H01L 33/507* (2013.01); *H01L 33/62* (2013.01); *H01L 33/50* (2013.01); *H01L 33/60* (2013.01); *H01L 2933/0041* (2013.01); *H01L 2933/0058* (2013.01); *H01L 2933/0066* (2013.01)

(58) Field of Classification Search
CPC .. G02B 6/0091; G02B 6/0055; G02B 6/0058; G02B 6/0065; G02B 6/0073; G02B 6/0083; G02B 6/0086; G02B 6/0095; G02B 6/0021; G02B 6/0023; G02B 6/0031; H01L 2933/0058
See application file for complete search history.

(56) References Cited

U.S. PATENT DOCUMENTS

| 7,909,496 B2 | 3/2011 | Matheson et al. |
| 2007/0284600 A1 | 12/2007 | Shchekin et al. |
| (Continued) | | |

FOREIGN PATENT DOCUMENTS

| CN | 106133928 A | 11/2016 |
| JP | H05-297813 A | 11/1993 |
| (Continued) | | |

*Primary Examiner* — Y M. Quach Lee
(74) *Attorney, Agent, or Firm* — Hunton Andrews Kurth LLP

(57) ABSTRACT

A light emitting module includes a light guide plate including a first face, a second face opposing the first face, and a through part penetrating between the first face and the second face, a light emitting device disposed in the through part on a second face side, a light transmissive member disposed on the light emitting device in the through hole on a first face side and between the light emitting device and a lateral wall of the through part, and a first light reflecting member disposed between an upper face of the light emitting device and the light transmissive member while being in contact with the upper face of the light emitting device.

6 Claims, 18 Drawing Sheets

(56) References Cited

U.S. PATENT DOCUMENTS

| | | |
|---|---|---|
| 2009/0296367 A1 | 12/2009 | Sekine et al. |
| 2010/0059782 A1 | 3/2010 | Fujitomo et al. |
| 2011/0037740 A1 | 2/2011 | Yamaguchi |
| 2011/0149594 A1* | 6/2011 | Terajima .............. G02B 6/0021 362/606 |
| 2012/0162966 A1* | 6/2012 | Kim .................... G02B 6/0073 362/97.1 |
| 2014/0185316 A1* | 7/2014 | Kim .................... G02B 6/0023 362/613 |
| 2015/0129902 A1 | 5/2015 | Iino |
| 2015/0214446 A1 | 7/2015 | Boss et al. |
| 2015/0280093 A1 | 10/2015 | Tomita et al. |
| 2015/0340566 A1 | 11/2015 | Butterworth |
| 2016/0197253 A1 | 7/2016 | Miyashita et al. |
| 2017/0114979 A1 | 4/2017 | Kang et al. |
| 2018/0033920 A1 | 2/2018 | Steltenpol et al. |
| 2018/0239193 A1 | 8/2018 | Hayashi |
| 2019/0227214 A1* | 7/2019 | Chen ................... G02B 6/0031 |
| 2019/0324184 A1* | 10/2019 | Cai ..................... G02B 6/0055 |
| 2020/0049876 A1 | 2/2020 | Watanabe et al. |
| 2020/0049877 A1 | 2/2020 | Watanabe et al. |

FOREIGN PATENT DOCUMENTS

| | | |
|---|---|---|
| JP | 2000184137 A | 6/2000 |
| JP | 2005332719 A | 12/2005 |
| JP | 2007018936 A | 1/2007 |
| JP | 2008004948 A | 1/2008 |
| JP | 2008059786 A | 3/2008 |
| JP | 2010008837 A | 1/2010 |
| JP | 2010040791 A | 2/2010 |
| JP | 2010239105 A | 10/2010 |
| JP | 2011204566 A | 10/2011 |
| JP | 2011210674 A | 10/2011 |
| JP | 2011211085 A | 10/2011 |
| JP | 4996747 B2 | 5/2012 |
| JP | 2012114468 A | 6/2012 |
| JP | 2012212532 A | 11/2012 |
| JP | 2013012607 A | 1/2013 |
| JP | 2014033113 A | 2/2014 |
| JP | 5693800 B1 | 2/2015 |
| JP | 2015509655 A | 3/2015 |
| JP | 2015095488 A | 5/2015 |
| JP | 2015521803 A | 7/2015 |
| JP | 2015220307 A | 12/2015 |
| JP | 2016506634 A | 3/2016 |
| JP | 2018097974 A | 6/2018 |
| JP | 2018101521 A | 6/2018 |
| JP | 2018133304 A | 8/2018 |
| JP | 2018174334 A | 11/2018 |
| KR | 20170123644 A | 11/2017 |
| WO | 2010070885 A1 | 6/2010 |
| WO | 2013134017 A1 | 9/2013 |
| WO | 2014064871 A1 | 5/2014 |
| WO | 2014208495 A1 | 12/2014 |

* cited by examiner

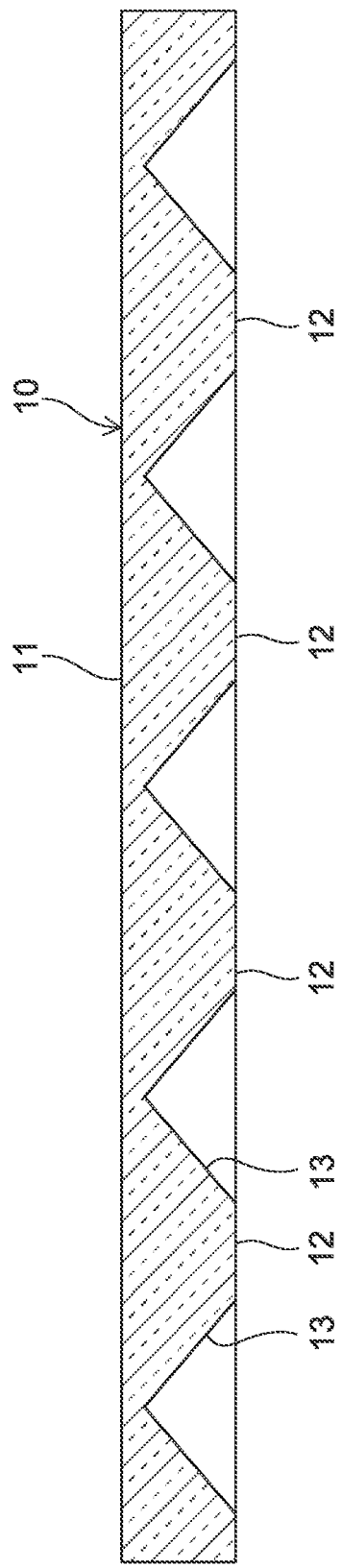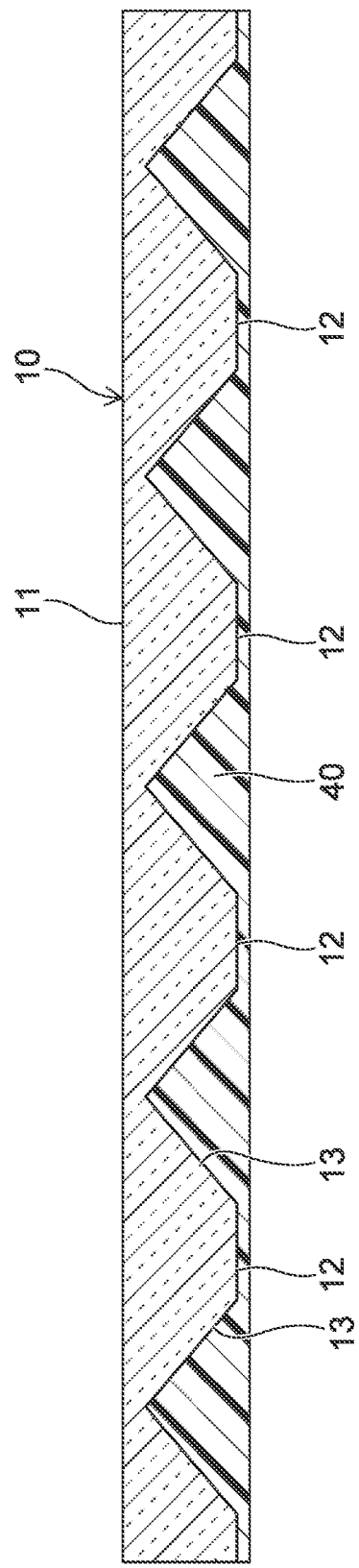

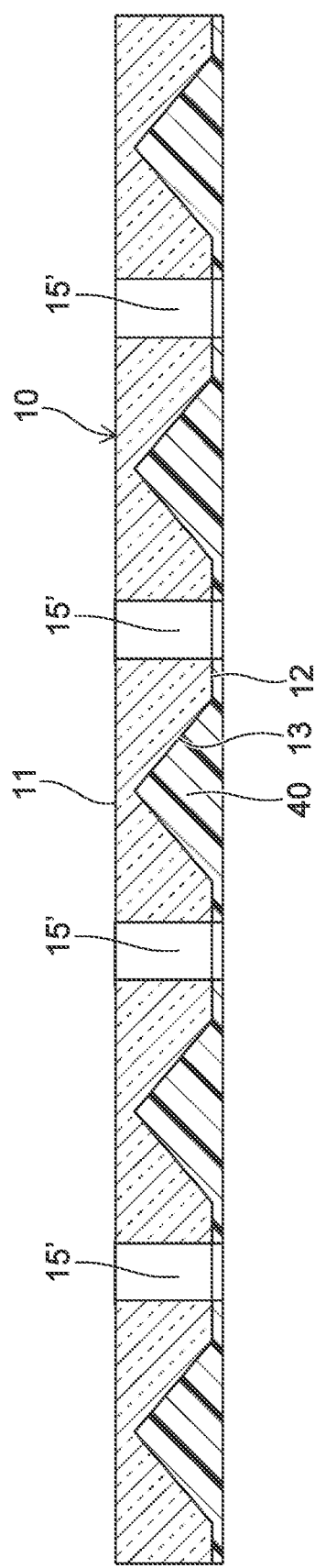
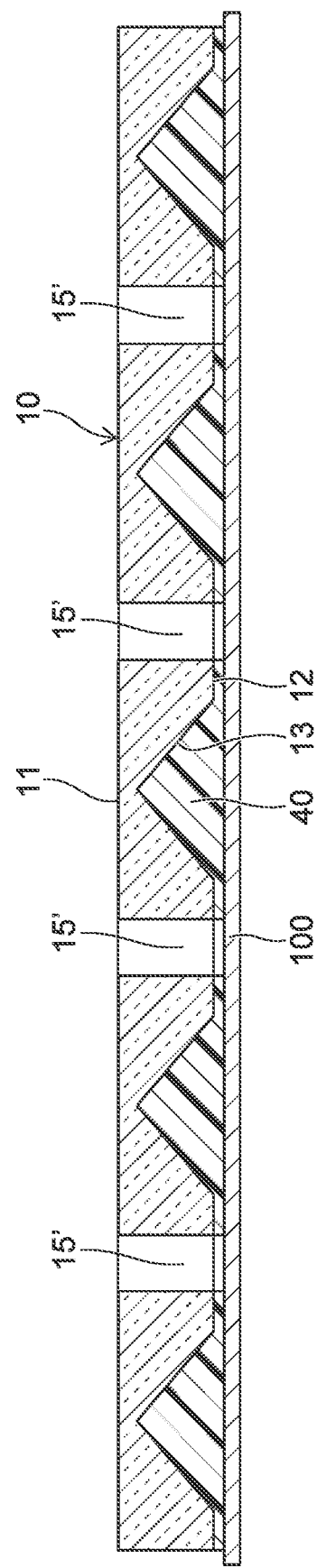
FIG. 4A
FIG. 4B

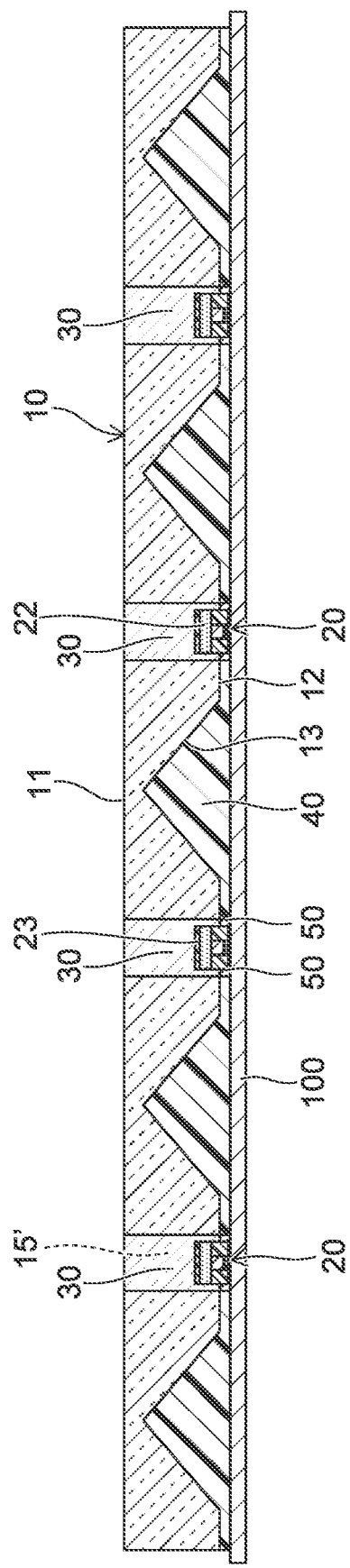
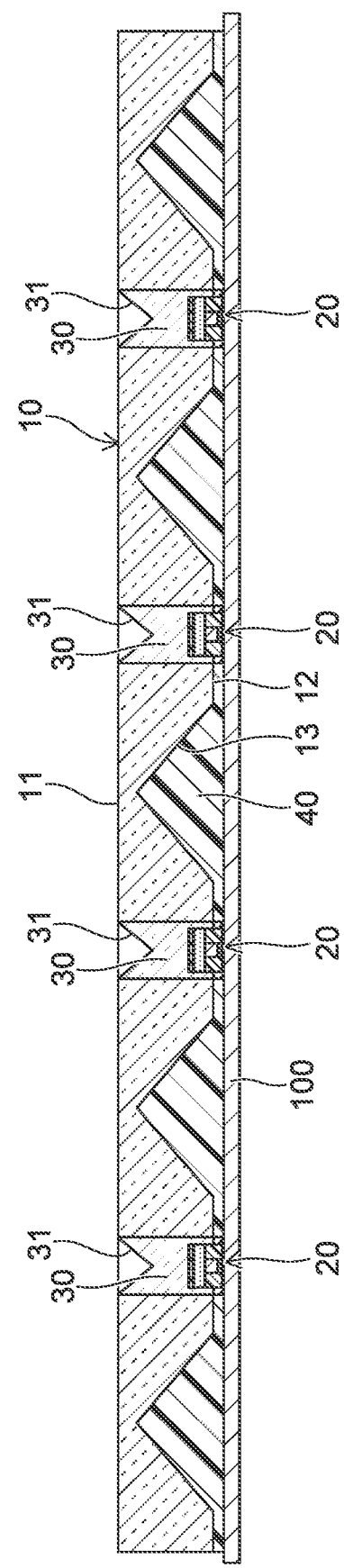
FIG. 6A
FIG. 6B

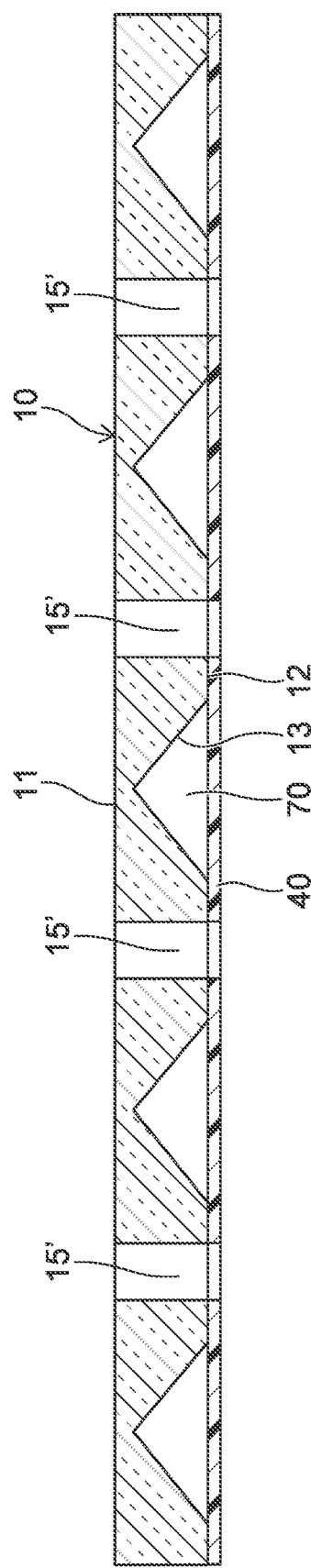
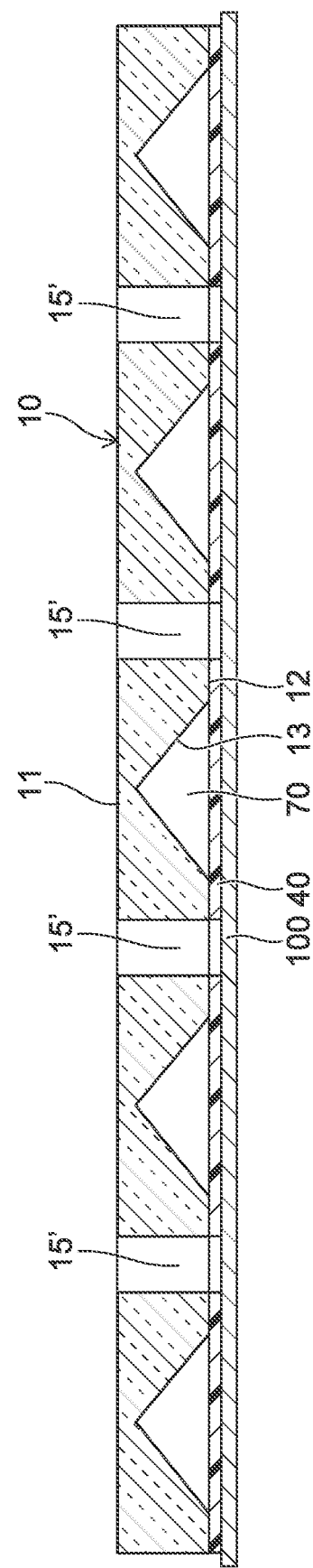
FIG. 10A
FIG. 10B

LIGHT EMITTING MODULE AND METHOD OF MANUFACTURING SAME

CROSS-REFERENCE TO RELATED PATENT APPLICATION

This application claims priority to Japanese Patent Application No. 2019-101186, filed on May 30, 2019, and Japanese Patent Application No. 2020-015601, filed on Jan. 31, 2020, the entire disclosures of which are hereby incorporated reference in their entireties.

BACKGROUND

The present invention relates to a light emitting module and a method of manufacturing the same.

A light emitting module which combines a light guide plate and a light emitting device such as a light emitting diode has been widely used as a planer light source such as a backlight for a liquid crystal display. For example, Japanese Unexamined Patent Application Publication No. 2011-211085 discloses a structure made by bonding a light guide plate having a plurality of through holes to a substrate having a plurality of light sources so as to arrange the light sources in the through holes.

SUMMARY

The object of the present invention is to provide a light emitting module in which a light emitting device can be highly precisely positioned relative to a light guide plate, and a method of manufacturing the same.

According to one embodiment of the present invention, a light emitting module has a light guide plate comprising a first face, a second face opposing the first face, and a through part penetrating between the first face and the second face, a light emitting device disposed in the through part on a second face side, a light transmissive member disposed on the light emitting device in the through part on a first face side and between the light emitting device and a lateral wall of the through part, and a first light reflecting member disposed between an upper face of the light emitting device and the light transmissive member while being in contact with the upper face of the light emitting device.

According to another embodiment of the present invention, a method of manufacturing a light emitting module includes: forming a light reflecting member on a second face of a light guide plate which has a first face and the second face opposing the first face, and forming a through hole in the light guide plate penetrating between the first face and the second face so as to also penetrate the light reflecting member; adhering the second face of the light guide plate to a sheet thereby closing the opening of the through hole on a second face side with the sheet; placing a light emitting device including electrode parts in the through hole and bonding the electrode parts to the sheet which closes an opening of the through hole; forming a light transmissive member on the light emitting device in the through hole and between the light emitting device and a lateral wall of the through hole thereby fixing the light emitting device to the light guide plate using the light transmissive member; and separating the sheet from the light guide plate to which the light emitting device is fixed thereby exposing the electrode parts of the light emitting device on the second face side.

According to yet another embodiment of the present invention, a method of manufacturing a light emitting module includes: preparing a light guide plate comprising a first face, a second face opposing the first face, and a through hole penetrating between the first face and the second face; adhering the second face of the light guide plate to a sheet thereby closing an opening of the through hole on a second face side with the sheet; placing a light emitting device including electrode parts in the through hole and bonding the electrode parts to the sheet that closes the opening of the through hole; forming a light transmissive member on the light emitting device in the through hole and between the light emitting device and a lateral wall of the through hole thereby fixing the light emitting device to the light guide plate using the light transmissive member; and separating the sheet from the light guide plate to which the light emitting device is fixed thereby exposing the electrode parts of the light emitting device on the second face side.

In accordance with the embodiments of the present invention, a light emitting module in which a light emitting device can be placed relative to the light guide plate with high positioning accuracy, and a method of manufacturing the same, can be provided.

BRIEF DESCRIPTION OF THE DRAWINGS

FIG. 3A is a schematic cross-sectional view showing a method of manufacturing a light emitting module according to the embodiment of the present invention.

FIG. 3B is a schematic cross-sectional view showing the method of manufacturing a light emitting module according to the embodiment of the present invention.

FIG. 4A is a schematic cross-sectional view showing the method of manufacturing a light emitting module according to the embodiment of the present invention.

FIG. 4B is a schematic cross-sectional view showing the method of manufacturing a light emitting module according to the embodiment of the present invention.

FIG. 6A is a schematic cross-sectional view showing the method of manufacturing a light emitting module according to the embodiment of the present invention.

FIG. 6B is a schematic cross-sectional view showing the method of manufacturing a light emitting module according to the embodiment of the present invention.

FIG. 10A is a schematic cross-sectional view showing a method of manufacturing a light emitting module according to the embodiment of the present invention.

FIG. 10B is a schematic cross-sectional view showing a method of manufacturing a light emitting module according to the embodiment of the present invention.

DESCRIPTION

Figure 1:
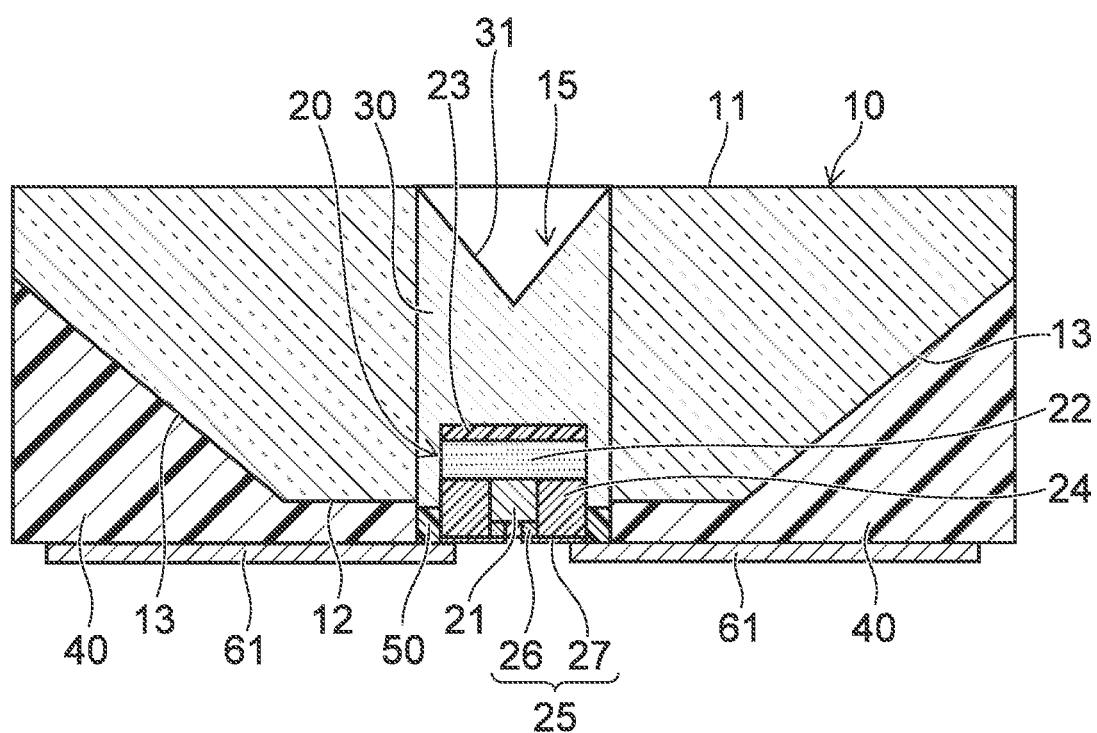
FIG. 1 is a schematic cross-sectional view of a light emitting module according to one embodiment of the present invention.

Certain embodiments of the present invention will be explained below with reference to the accompanying drawings. In the drawings, the same reference numerals denote the same elements.

FIG. 1 is a schematic cross-sectional view of a light emitting module according to one embodiment of the present invention. FIG. 1 shows a cross section cut along a line through the central axis of a through part 15 formed in the light guide plate 10.

The light emitting module according to the embodiment may comprise a light guide plate 10, a light emitting device 20, and a light transmissive member 30.

The light guide plate 10 transmits the light emitted by the light emitting device 20. For the material used to construct the light guide plate 10, for example, thermoplastic resins, such as acrylic, polycarbonate, cyclic polyolefin, polyethylene terephthalate, polyester, or the like, thermosetting resins, such as epoxy, silicone, or the like, or glass can be used. The thickness of the light guide plate 10 is preferably 100 µm to 1000 µm, more preferably 200 µm to 800 µm.

The light guide plate 10 has a first face 11, which serves as the emission face, and a second face 12 which opposes the first face 11. Furthermore, the light guide plate 10 has a through part 15 penetrating between the first face 11 and the second face 12.

The light emitting device 20 may comprise a light emitting element 21, and a phosphor layer 22 as a light transmissive member. The phosphor layer 22 is disposed on the upper face of the light emitting element 21. The phosphor layer 22 may be in contact with the upper face of the light emitting element 21, or bonded via an adhesive or the like. The light emitting element 21 has a semiconductor stack. The semiconductor stack includes, for example, $In_xAl_yGa_{1-x-y}N$ (0≤x, 0≤y, x+y≤1), and can emit blue light.

The phosphor layer 22 may comprise a base material and phosphor particles dispersed in the base material. For the base material of the phosphor layer 22, for example, a silicone resin, epoxy resin, glass, or the like can be used. A phosphor is a wavelength conversion substance that is excited by the light emitted by the light emitting element 21 and emits light having a different wavelength from that of the light emitted by the light emitting element 21. For example, yttrium aluminum garnet-based phosphors (e.g., $Y_3(Al,Ga)_5O_{12}$:Ce), lutetium aluminum garnet-based phosphors (e.g., $Lu_3(Al,Ga)_5O_{12}$:Ce), terbium aluminum garnet-based phosphors (e.g., $Tb_3(Al,Ga)_5O_{12}$:Ce), β-SiAlON phosphors (e.g., $Si_{6-z}Al_zO_zN_{8-z}$:Eu (0<z<4.2)), α-SiAlON phosphors (e.g., $Mz(Si,Al)_{12}(O,N)_{16}$ (0<z≤2, M is Li, Mg, Ca, Y, and lanthanide elements excluding La and Ce), nitride-based phosphors such as nitrogen-containing calcium aluminosilicate (CASN or SCASN) phosphors (e.g., (Sr,Ca)AlSiN$_3$:Eu), fluoride-based phosphors such as KSF-based phosphors ($K_2SiF_6$:Mn) or MGF-based phosphors ($3.5MgO•0.5MgF_2•GeO_2$:Mn), silicate-based phosphors (e.g., $(Ba,Sr)_2SiO_4$:Eu), chlorosilicate-based phosphors (e.g., $Ca_8Mg(SiO_4)_4Cl_2$:Eu), and the like can be used for the phosphor. The phosphor layer 22 may contain several different phosphors. Moreover, multiple layers of the phosphors described above may be stacked.

A second light reflecting member 24 is disposed on the lateral faces of the light emitting element 21. A pair of positive and negative element electrodes are disposed on the face opposite the upper face of the light emitting element 21. The element electrodes may be equipped with ohmic electrodes that are in ohmic contact with the semiconductor layer and columnar electrodes connected to the ohmic electrodes (post electrodes 26). A conducting film 27 is disposed on the lower faces of the post electrodes 26 and the lower face of the second light reflecting member 24. A light emitting element 21 equipped with post electrodes 26 will be explained below. However, the post electrodes 26 can be omitted, and in that case, the post electrodes 26 can be replaced as element electrodes.

The post electrodes 26 are connected to the conducting film 27. The post electrodes 26 are disposed on the lower face of the light emitting element 21, and the conducting film 27 extends from the post electrodes 26 outwards of the lower face (lateral faces) of the light emitting element 21. The post electrodes 26 and the conducting film 27 function as the electrode parts 25 of the light emitting device 20. The conducting film 27 may be disposed to cover only the lower faces of the post electrodes 26. The light emitting device may be produced without a conducting film 27.

The second light reflecting member 24 is disposed on the lateral faces of the light emitting element 21 between the conducting film 27 and the phosphor layer 22. The second light reflecting member 24 directly or indirectly covers the lateral faces of the light emitting element 21. For example, the adhesive for bonding the phosphor layer 22 and the light emitting element 21 may be disposed on the lateral faces of the light emitting element 21, and the lateral faces of the light emitting element 21 may be covered with the second light reflecting member 24 via the adhesive. The second light reflecting member 24 is also disposed between the pair of post electrodes 26 at the lower face of the light emitting element 21. In other words, at least a portion of the lower face of the semiconductor stack of the light emitting element 21 is covered with the second light reflecting member 24.

A light emitting device 20 is disposed in the through part 15 on the second face 12 side of the light guide plate 10. In other words, the light emitting device 20 is disposed in a position that is closer to the second face 12 than to the first face 11. The light emitting element 21 is positioned closer to the second face 12 than the phosphor layer 22, and the phosphor layer 22 is positioned closer to the first face 11 than the light emitting element 21.

A light transmissive member 30 is disposed in the through part 15 of the light guide plate 10. The light transmissive member 30 transmits the light emitted by the light emitting device 20, and can be made by using, for example, the same resin material as that employed for the light guide plate 10 or a resin having a small refractive index difference from that of the material used for the light guide plate 10. Alternatively, glass may be used as the material for the light transmissive member 30.

The light transmissive member 30 is disposed on the light emitting device 20, and between the lateral faces of the light emitting device 20 and the lateral wall of the through part 15. The light emitting device 20 is fixed to the light guide plate 10 by the light transmissive member 30. There is no space such as an air layer formed between the lateral faces of the light emitting device 20 and the light transmissive member 30, between the lateral wall of the through part 15 and the light transmissive member 30, or between the upper face of the light emitting device 20 and the light transmissive member 30. It is not limited to this, however, and the light transmissive member 30 may include an air layer.

A recessed part 31 can be created in the upper face of the light transmissive member 30. The recessed part 31 can have a shape of a cone, pyramid, truncated cone, frustum, or the like. Alternatively, it can have an indented shape, such as a triangular prism or semicylinder, to be able to refract light only in one direction in a plan view. The diameter of the opening of the recessed part 31 can be the same as the diameter of the through part 15. Alternatively, the diameter of the opening of the recessed part 31 can be smaller than the diameter of the through part 15. The center of the recessed part 31 in a plan view can coincide with the center of the through part 15. Furthermore, the center of the recessed part 31 in a plan view can coincide with the center of the light emitting device 20. Alternatively, depending on the position of the through part 15, the center of the recessed part 31 in a plan view does not have to coincide with the center of the through part 15 or the light emitting device 20. In the example shown in FIG. 1, a recessed part 31 having a V-shaped cross section is provided. In other words, an oblique face that is oblique to the first face 11 is provided in the upper face of the light transmissive member 30. By allowing the oblique face, i.e., the interface between the light transmissive member 30 and the air, to reflect and refract light, luminance concentration in the region directly above the light emitting device 20 can be moderated. Alternatively, by disposing a curved face or a projected part in the upper face of light transmissive member 30, light diffusion and light extraction efficiency can be improved.

A first light reflecting member 23 is disposed between the upper face of the phosphor layer 22 which is the upper face of the light emitting device 20 and the light transmissive member 30. The first light reflecting member 23 is in contact with and covers the upper face of the light emitting device 20, i.e., the upper face of the phosphor layer 22 in this example. The first reflecting member 23 may be a part of the light emitting device 20.

A third light reflecting member 50 is disposed around the light emitting device 20 placed in the through part 15 on the second face 12 side of the light guide plate 10. The third light reflecting member 50 is disposed on the lateral faces of the second reflecting member 24, but is not disposed at least portions of the lateral faces of the phosphor layer 22. The lateral faces of the phosphor layer 22 are covered in part or whole by the light transmissive member 30. It is preferable for the lateral faces of the phosphor layer 22 to be entirely in contact with the light transmissive member 30.

Figure 2:
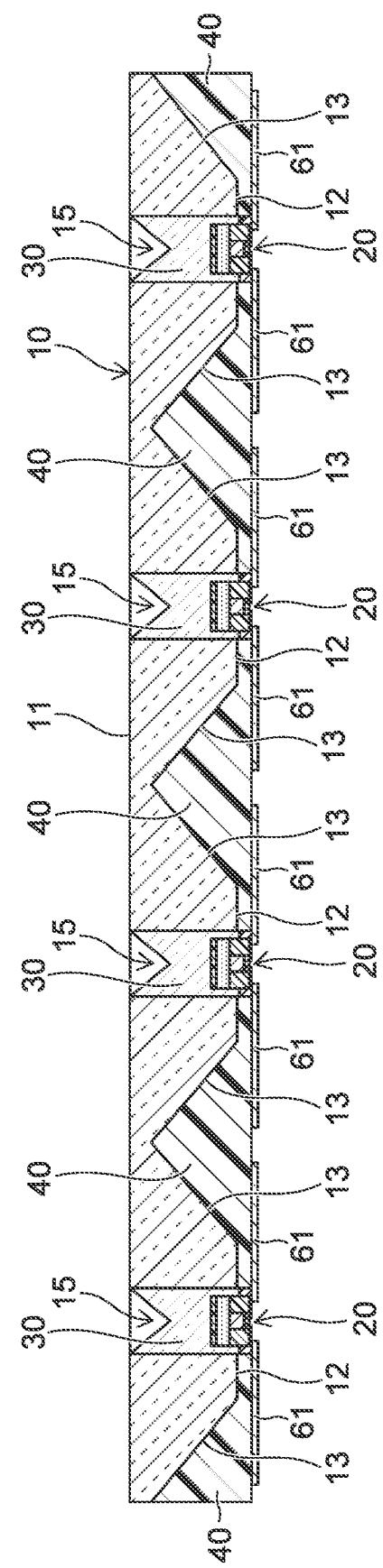
FIG. 2 is a schematic cross-sectional view of a light emitting module according to the embodiment of the present invention.

The second face 12 of the light guide plate 10 may have a flat face paralleling the first face 11 and a recessed part having an oblique face 13 which is the inner lateral face. The corner formed by the second face 12 and the oblique face 13 may have a curvature. Alternatively, there may be a straight line portion between the second face 12 and the oblique face 13. A fourth light reflecting member 40 is disposed on the second face 12 and the oblique face 13, i.e., the inner lateral face of the recessed part. The lateral face 13 of the second face 12 is the inner lateral face of the recessed part provided in the second face 12 so as to surround the through hole in a plan view. In the case where the light guide plate 10 includes a plurality of through parts 15, the lateral faces 13 are, for example, the inner faces of recesses located between adjacent through parts 15 as shown in FIG. 2. In the case where the light guide plate 10 includes a plurality of through parts 15, the recessed parts of the second face 12 are provided in a lattice, and the through parts 15 are individually provide in the regions defined by lattice. The second face 12 of the light guide plate 10 may be without oblique face 13. In other words, the second face 12 may be a flat surface. The second face 12 may be composed only with a lateral face without a flat surface. In other words, the through part 15 may be in contact with the lateral face 13.

The first light reflecting member 23, the second light reflecting member 24, the third light reflecting member 50, and the fourth light reflecting member 40 can be of a white resin containing a light reflecting material (or a light scattering material), for example. The first light reflecting member 23, the second light reflecting member 24, the third light reflecting member 50, and the fourth light reflecting member 40 are, for example, a silicone resin or an epoxy resin containing as a light reflecting material (or a light scattering material) particles of $TiO_2$, $SiO_2$, $Al_2O_3$, ZnO, or the like. A light reflecting metal or dielectric film (dielectric sheet) can alternatively be used for the first light reflecting member 23 and the fourth light reflecting member 40. When used as the first light reflecting member 23 and the fourth light reflecting member 40, a resin sheet containing air bubbles that is visually recognized as white can be employed in addition to the resin sheet made of a white resin described above.

The first light reflecting member 23 reflects a portion of the light emitted upwards from the light emitting device 20 laterally and downwards, while transmitting another portion. This can reduce the luminance directly above the light emitting device 20 so as not to be excessively more luminous than the remaining area in the emission face of the light emitting module.

The light emitted downwards from the phosphor layer and the light emitted laterally and downwards from the light emitting element 21 is reflected by the second light reflecting member 24 and the third light reflecting member 50 upwards, thereby increasing the luminance of the light extracted from the first face 11 which is the emission face.

The fourth light reflecting member 40 disposed on the second face 12 and the oblique face 13 of the light guide plate 10 reflects the light guided through the light guide plate 10 towards the first face 11, thereby increasing the luminance of the light extracted from the first face 11.

The lower face of the fourth light reflecting member 40, the lower face of the third light reflecting member 50, and the lower face of the conducting film 27 are coplanar, and metal-containing wiring 61 is disposed on the lower face of the fourth light reflecting member 40, the lower face of the third light reflecting member 50, and the lower face of the conducting film 27. The conducting film 27 is connected to the wiring 61. The light emitting module is mounted on a circuit board via the wiring 61.

As shown in FIG. 2, a plurality of through parts 15 may be created in a single light guide plate 10 to arrange a plurality of light emitting devices 20. A light emitting device 20 is disposed in each through part 15, and each light emitting device 20 is fixed to the light guide plate 10 by a light transmissive member 30. Such a construction can achieve a large planar light source with limited luminance unevenness.

Next, a method of manufacturing a light emitting module according to one embodiment will be explained with reference to FIG. 3A to FIG. 8B.

As shown in FIG. 3A, a light guide plate 10 is prepared first. The light guide plate 10 has a first face 11, a second face 12 opposing the first face 11, and recessed parts having, as inner lateral faces, oblique faces 13 each forming an obtuse angle with the second face 12. The recessed parts are formed in a lattice. Such a light guide plate 10 can be prepared, for example, by purchasing or forming by injection molding or the like a sheet-shaped light transmissive member and forming recessed parts by using machine tools. Alternatively, it can be prepared by purchasing a light guide plate already equipped with recessed parts, or forming a light guide plate with recessed parts by injection molding or the like.

As shown in FIG. 3B, a fourth light reflecting member 40 is formed on the second face 12, i.e., the flat surfaces and the oblique faces 13 which are inner lateral faces of the recessed parts, of the light guide plate 10. In the case where the fourth light reflecting member 40 is a white resin material, a liquid or paste light reflecting resin is applied by using a method, such as printing, spraying, compression molding, or transfer molding, followed by hardening the resin. Alternatively, a light reflecting sheet separately formed may be adhered. In the case where the fourth light reflecting member 40 is a metal, it can be formed by adhering metal foil, sputtering, vapor deposition, printing using a paste, or the like. In the case where the fourth light reflecting member 40 is a dielectric material, it can be formed by adhering a dielectric sheet, sputtering, or the like.

Figure 8A:
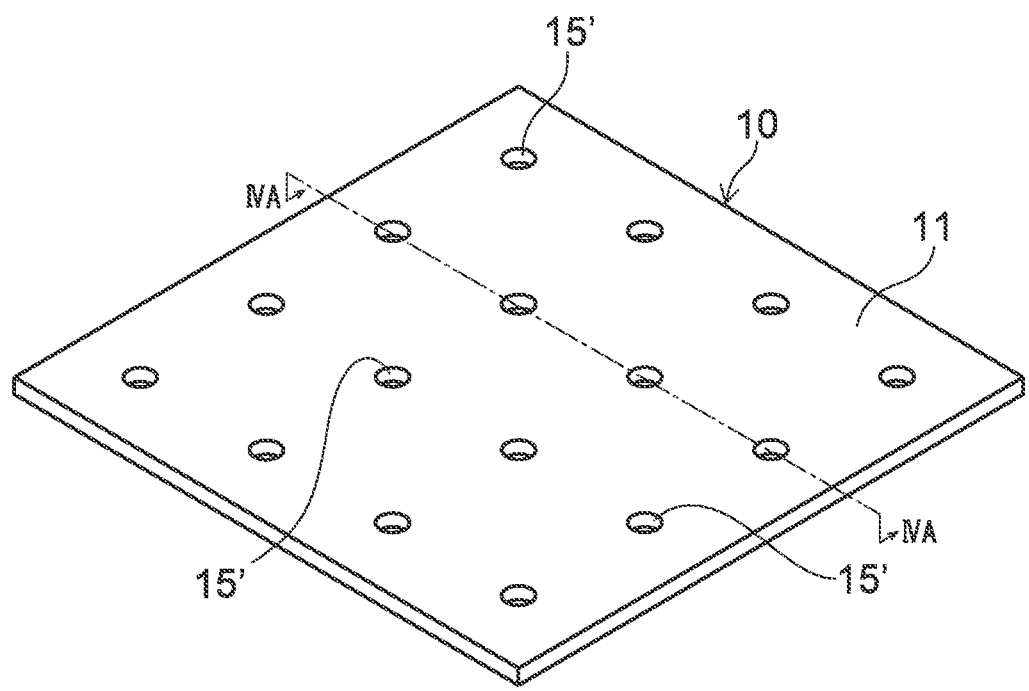
FIG. 8A is a schematic perspective view showing the method of manufacturing a light emitting module according to the embodiment of the present invention.

After forming the fourth light reflecting member 40, as shown in FIG. 4A, a plurality of through holes 15' penetrating between the first face 11 and the second faces 12 are created in the light guide plate 10 so as to also penetrate the fourth light reflecting member 40. FIG. 8A is a perspective view of a light guide plate 10 after creating the through holes 15' when viewed from the first face 11 side. FIG. 4A is a sectional view taken along line IVA-IVA in FIG. 8A. In the example shown in FIG. 8A, the planar shape of a through hole 15' can be circular, or may be polygonal, such as a triangle, square, or the like. In the case of a polygonal shape, the corners of the shape may be curved or chamfered.

Figure 8B:
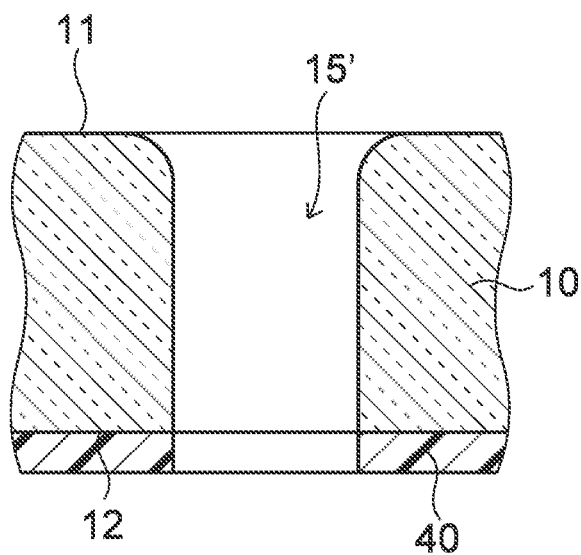
FIG. 8B is a schematic cross-sectional view showing the method of manufacturing a light emitting module according to the embodiment of the present invention.

The through holes 15' can be formed by mechanical processing, for example, drilling, punching, or the like. Alternatively, the through holes 15' may be formed by etching or laser processing. In the case of mechanical processing, as shown in FIG. 8B, the edges of the through holes 15' may be rounded or have curvature. Furthermore, in the case of mechanical processing, projections and indentations might be formed on the inner walls of the through holes 15'.

After forming the through holes 15', as shown in FIG. 4B, the second face 12 side of the light guide plate 10 is adhered to a sheet 100. In this example, the surface of the fourth light reflecting members 40 is adhered to the sheet 100. The openings of the through holes 15' on the second face 12 side are closed by the sheet 100. Portions of the sheet 100 form the bottom faces of the through holes 15'.

Figure 5A:
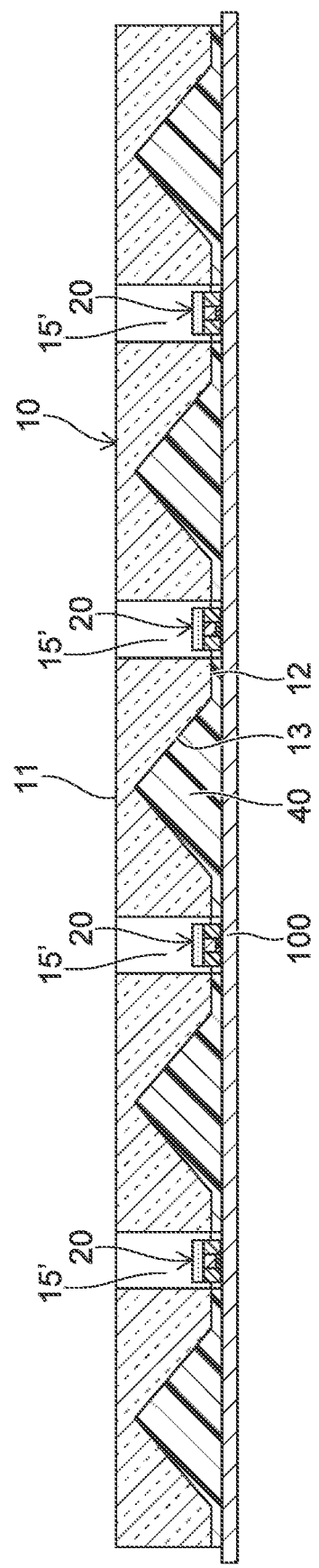
FIG. 5A is a schematic cross-sectional view showing a method of manufacturing a light emitting module according to the embodiment of the present invention.

As shown in FIG. 5A, the light emitting device 20 described above is disposed in each through hole 15'. In more detail, the conducting film 27 making up the electrode parts 25 of each light emitting device 20 shown in FIG. 1 is adhered to the sheet 100 that closes the opening of each through hole 15' on the second face 12 side. There is a gap between the lateral faces of each light emitting device 20 and the lateral wall of the through hole 15'.

Figure 5B:
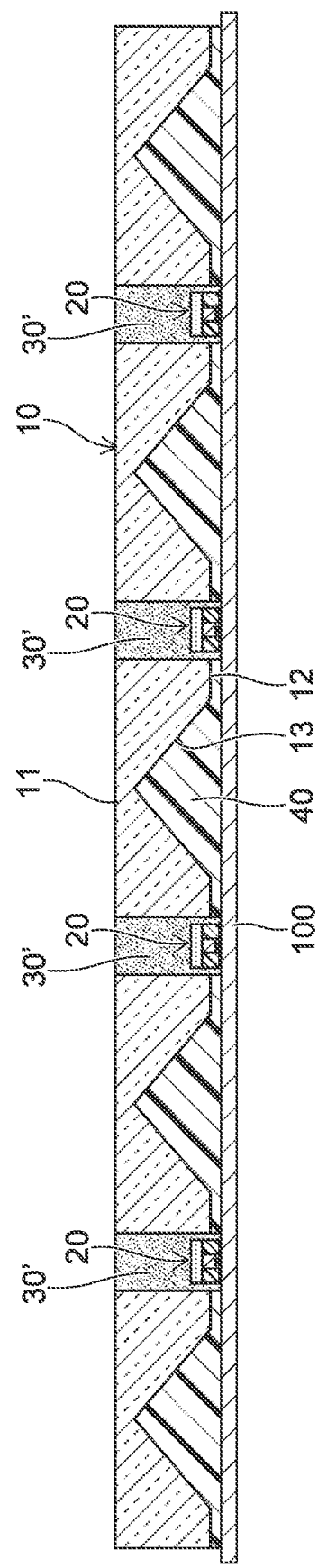
FIG. 5B is a schematic cross-sectional view showing the method of manufacturing a light emitting module according to the embodiment of the present invention.

After disposing light emitting devices 20 in the through holes 15', as shown in FIG. 5B, a liquid resin 30' is supplied in the through holes 15'. Examples of methods of supplying the resin 30' include potting, spraying, dispensing, jet dispensing, printing, and the like. The resin 30' contains a light reflecting material such as particles of $TiO_2$, $SiO_2$, $Al_2O_3$, ZnO or the like.

Then the light reflecting material contained in the resin 30' is settled on the upper faces of the light emitting devices 20 and the sheet 100 where it closes the openings of the through holes 15' on the second face 12 side by applying a centrifugal force. The light reflecting material settling on the sheet 100 settles in the regions lower than the phosphor layers 22.

As shown in FIG. 6A, allowing the light reflecting material to settle forms a first light reflecting member 23 on the upper face of the phosphor layer 22 of each light emitting device 20, and a third light reflecting member 50 around the light emitting device 20 on the second face 12 side.

After settling the light reflecting material, the resin 30' is hardened. For example, the resin 30' is thermally set at a temperature around 150° C. The sheet 100 may have thermal resistance to this temperature.

Hardening the resin 30' forms the light transmissive member 30 on the light emitting devices 20 in the through holes 15' and between the light emitting devices 20 and the lateral walls of the through holes 15', and the light emitting devices 20 are fixed to the light guide plate 10 by the light transmissive members 30.

Pressing the upper faces of the light transmissive members 30 using a forming die creates recessed parts 31 on the upper faces of the light transmissive members 30 as shown in FIG. 6B. Alternatively, the recessed parts 31 can be formed by using volume contraction of the light transmissive members 30 when hardened or allowing the resin 30' to creep up the inner lateral faces of the through holes 15' by using surface tension.

Figure 7:
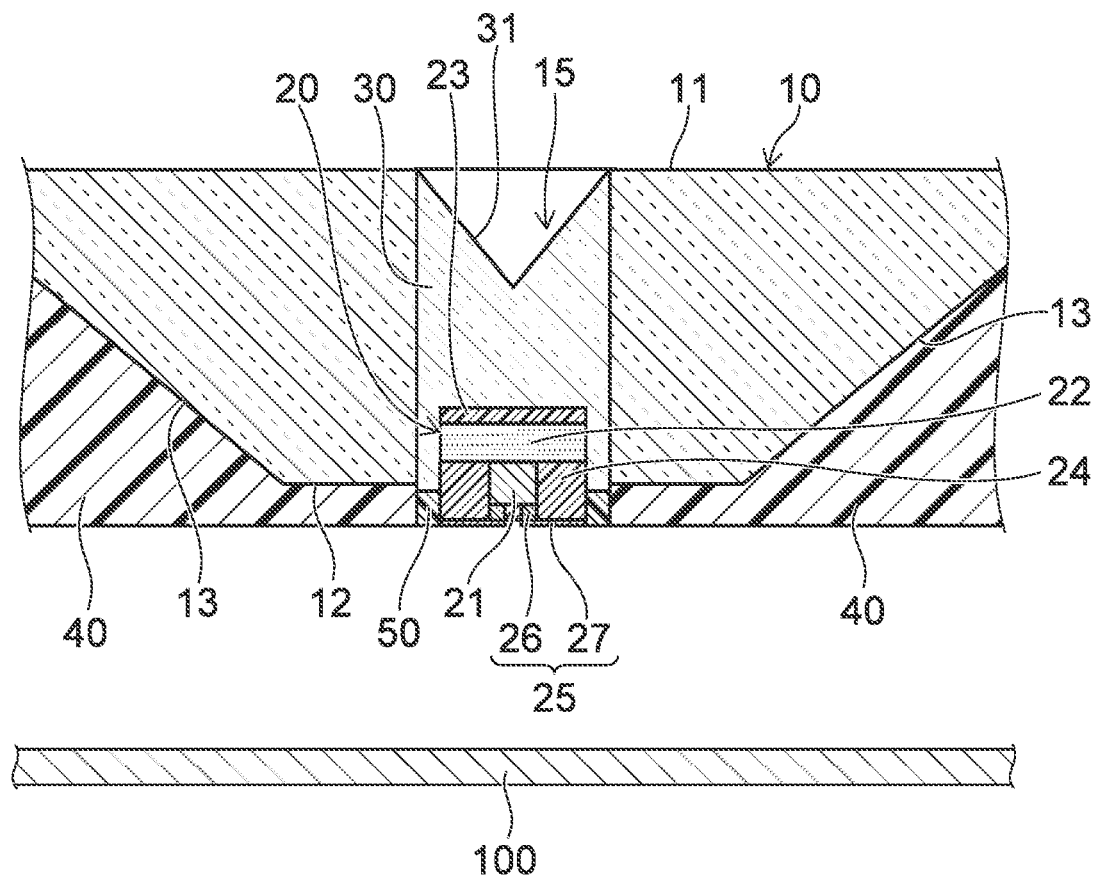
FIG. 7 is a schematic cross-sectional view showing the method of manufacturing a light emitting module according to the embodiment of the present invention.

Subsequently, when the sheet 100 is separated from the light guide plate 10 to which the light emitting devices 20 are fixed, as shown in FIG. 7, the conducting film 27 making up the electrode parts 25 of the light emitting devices 20 is exposed on the second face 12 side. The wiring 61 shown in FIG. 1 is formed on the second face 12 side to be connected to the exposed conducting film 27.

In accordance with the embodiment of the present invention, through holes 15' are created after forming the fourth light reflecting member 40 on the second face 12, and light emitting devices 20 are disposed in the through holes 15'. Thus, the electrode parts 25 of the light emitting devices 20 are not covered with the fourth light reflecting member 40. Moreover, because the resin 30' is supplied to the through holes 15' after adhering the electrode parts 25 of the light emitting devices 20 to the sheet 100, the electrode surfaces of the light emitting devices 20 are not covered with the resin 30'. In this example, because the lower face of the conducting film 27 is in contact with the sheet 100, it is not covered with the resin 30'. The electrode surfaces of the light emitting devices 20 are exposed by detaching the sheet 100 after hardening the resin 30'. This makes it unnecessary to remove the fourth light reflecting member 40 and the resin 30' that would otherwise cover the electrode surfaces of the light emitting devices 20, thereby allowing the wiring 61 to be easily connected to the electrode surfaces.

Disposing a conducting film 27 to extend from the post electrodes 26 provided at the lower face of each light emitting element 21 to the area outward of the lower face of the light emitting element 21 can easily achieve the connection between the electrode parts 25 of the light emitting device 20 and the wiring 61, achieving a highly reliable wiring connection.

In the case of bonding a light guide board 10 with a plurality of through holes 15' to a structure in which a plurality of light emitting devices 20 have been mounted on a circuit board to thereby arrange the light emitting devices 20 in the through holes 15', in particular, high precision is required to align the mounting positions of the light emitting devices 20 on the circuit board with the positions of the through holes 15' in the light guide plate 10.

In contrast, in accordance with the embodiment of the present invention, the light guide plate 10 and the light emitting devices 20 are integrally structured by allowing the light guide plate 10, not a wiring board, to hold in place the light emitting devices 20. Thus, the light emitting devices 20 can be arranged with high positioning accuracy relative to the light guide plate 10. This can reduce luminance unevenness in the emission face of the light guide plate 10.

Furthermore, bonding a flexible wiring board to the wiring 61, for example, can reduce the overall thickness of the module, including the wiring board. Such a light emitting module is suited for the backlight of a direct-lit liquid crystal display, for example.

Figure 9:
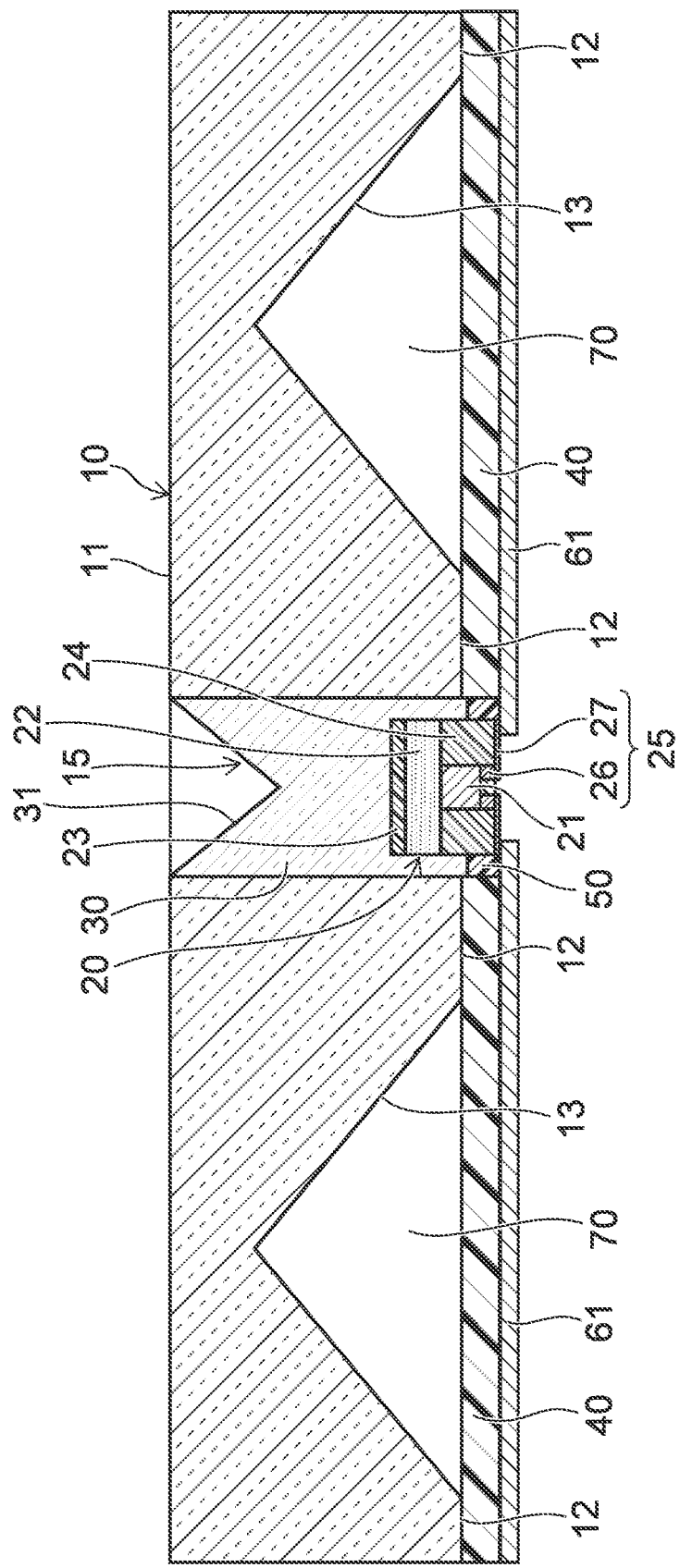
FIG. 9 is a schematic cross-sectional view of a light emitting module according to another embodiment of the present invention.

FIG. 9 is a schematic cross-sectional view of a light emitting module according to another embodiment.

The fourth light reflecting member 40 is not disposed on the oblique faces 13 of the light guide plate 10. The oblique faces 13 are contacting the air layers 70 located between the fourth light reflecting member 40 and the oblique faces 13. The refractive index of the material composing the light guide plate 10 is higher than the refractive index of air. The refractive indices here refer to those relative to the light emitted by the light emitting devices 20. Accordingly, the light guided through the light guide plate 10 is completely reflected by the oblique faces 13 towards the first face 11, thereby increasing the luminance of the light extracted from the first face 11.

In manufacturing the structure shown in FIG. 9, as shown in FIG. 10A, the second face 12 of the light guide plate 10 equipped with oblique faces 13 formed by processing or the like is adhered to a sheet-shaped fourth reflecting member 40 followed by creating through holes 15' so as to also penetrate the fourth reflecting member 40. Air layers 70 are present between the oblique faces 13 and the fourth light reflecting member 40. For the sheet-shaped fourth light reflecting member 40, for example, a white resin containing a light reflecting material (or a light scattering material), a multilayer film made of resins and ceramics, a multilayer dielectric film, a metal, or the like can be used.

Then as shown in FIG. 10B, the fourth reflecting member 40 is adhered to a sheet 100. Subsequently, light emitting devices 20 are disposed in the through holes 15', followed by processes similar to those described earlier. Similar to the other schematic cross-sectional views, FIG. 10A and FIG. 10B are cross sections taken along the line that goes through the centers of multiple through holes 15'.

Figure 11:
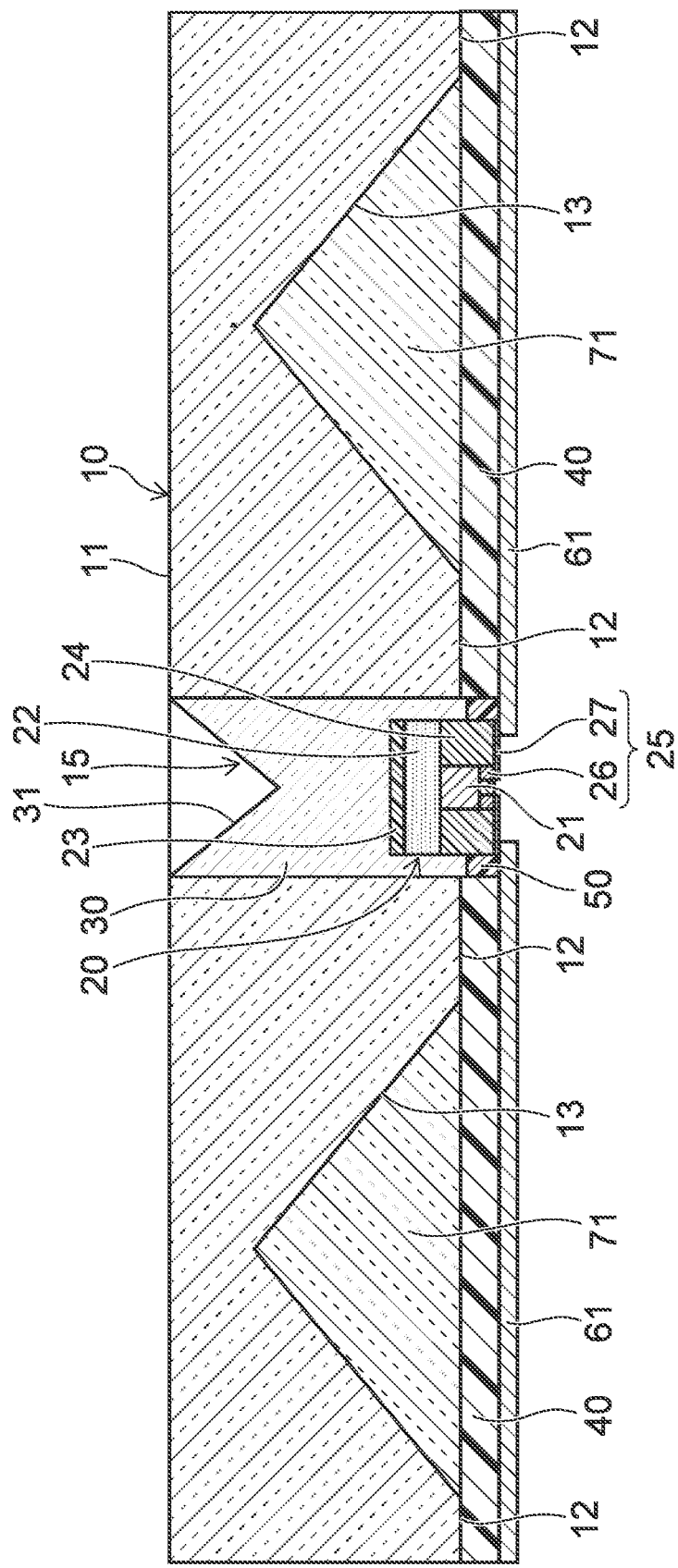
FIG. 11 is a schematic cross-sectional view of a light emitting module according to yet another embodiment of the present invention.

Furthermore, as shown in FIG. 11, a light transmissive resin 71 may be disposed on the oblique faces 13 of the light guide plate 10. The light transmissive resin 71 is disposed between the oblique faces 13 and the fourth light reflecting member 40. A material having a smaller refractive index than that of the light guide plate is suited for the light transmissive resin 71.

Figure 12:
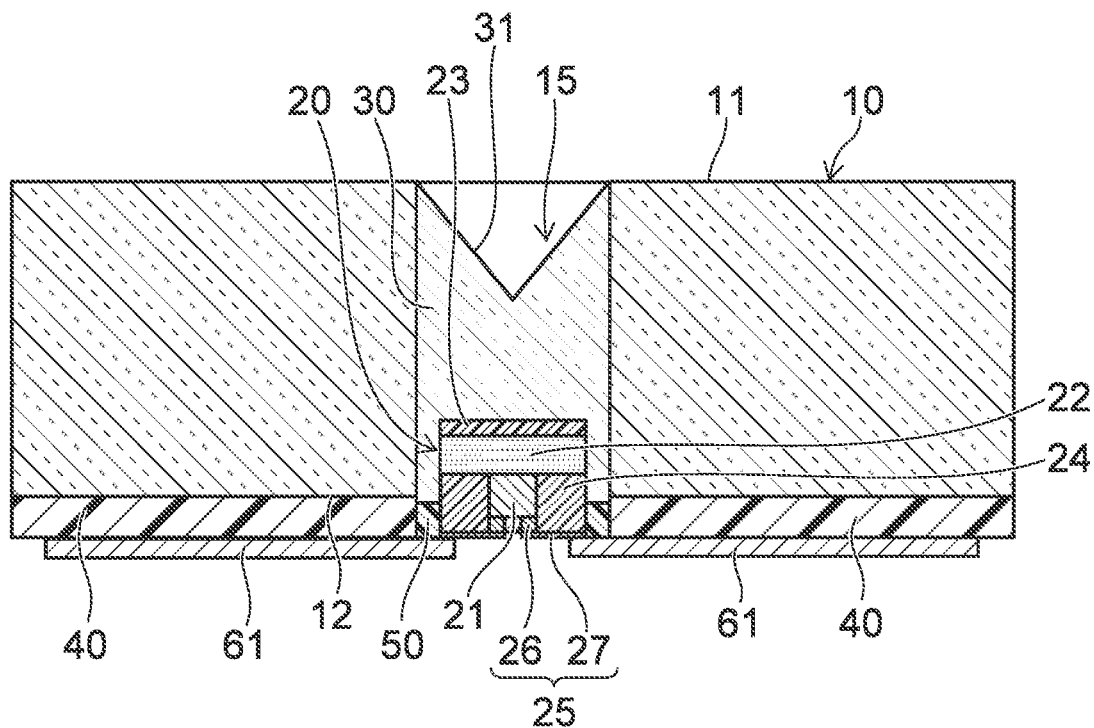
FIG. 12 is a schematic cross-sectional view of a light emitting module according to another embodiment of the present invention.

The light guide plate 10 may be sheet-shaped without oblique faces 13 as shown in FIG. 12.

Figure 13:
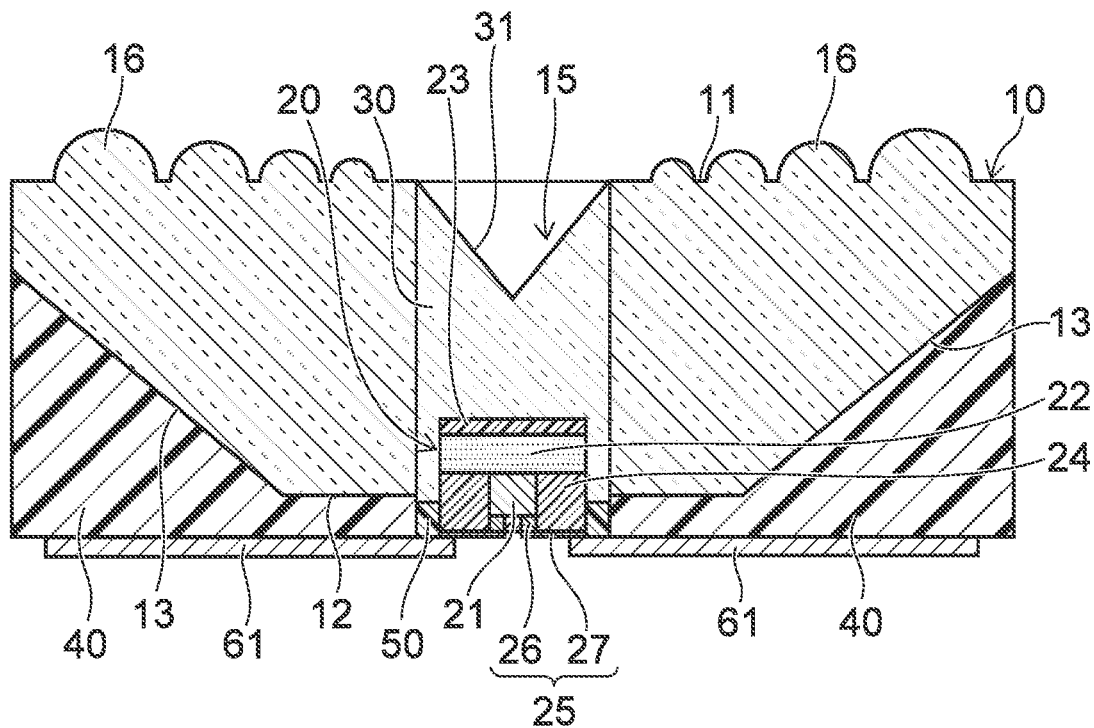
FIG. 13 is a schematic cross-sectional view of a light emitting module according to yet another embodiment of the present invention.

Alternatively, projections and indentations may be created on the first face 11 of the light guide plate 10 for diffusing light or increasing light extraction efficiency. FIG. 13 shows an example where multiple projected parts 16 are formed on the first face 11 of the light guide plate 10. The projected parts 16 are concentrically formed around a through hole 15, for example. The projected parts 16 may be dot shaped.

For example, the heights and the widths of projected parts 16 more distant from a light emitting device 20 near the outer periphery are larger than the heights and the widths of projected parts 16 closer to the light emitting device 20 near the inner periphery. Alternatively, the density of the projected parts 16 near the outer periphery can be made higher than the density of the projected parts 16 near the inner periphery. The first face 11 may be provided with not only projected parts, but also recessed parts.

Figure 14:
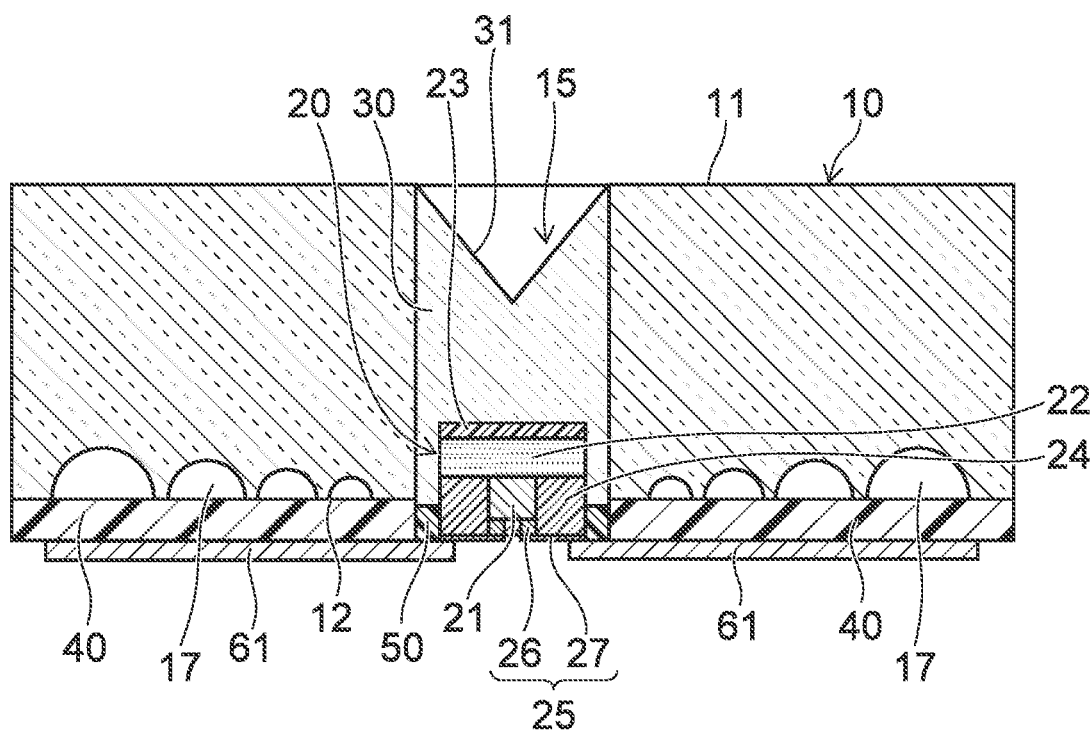
FIG. 14 is a schematic cross-sectional view of a light emitting module according to another embodiment of the present invention.

Moreover, projections and indentations may be created in the second face 12 of the light guide plate 10. FIG. 14 shows an example in which multiple recessed parts 17 are formed in the second face 12 of the light guide plate 10. The second face 12 may be provided with not only recessed parts 17, but also projected parts. The projection or indentation shape is not limited to a curved surface, the projections and indentations may be composed of continuous oblique faces.

Figure 15:
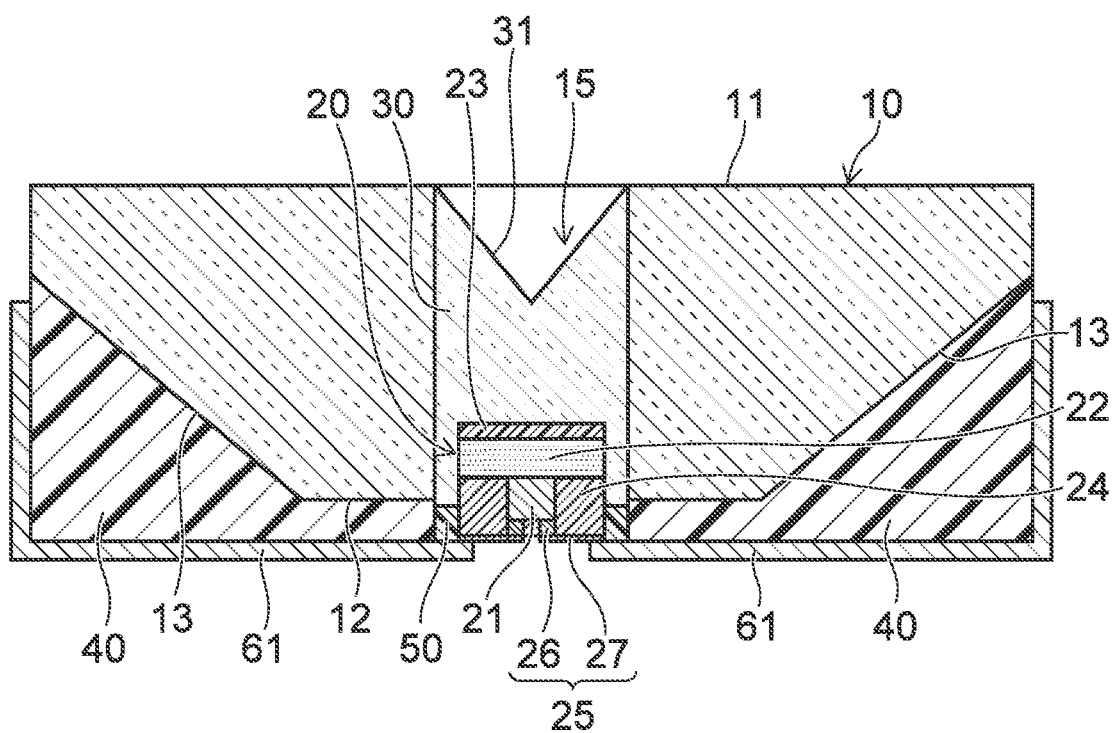
FIG. 15 is a schematic cross-sectional view of a light emitting module according to yet another embodiment of the present invention.

As shown in FIG. 15, for example, the wiring 61 may also be formed on the lateral faces of the fourth light reflecting member 40 which make up the lateral faces of the light emitting module. In the case of arranging a plurality of light emitting modules while allowing adjacent lateral faces to be in contact, the wiring 61 formed on the lateral faces of adjacent light emitting modules can be connected directly or via a conducting material.

Figure 16:
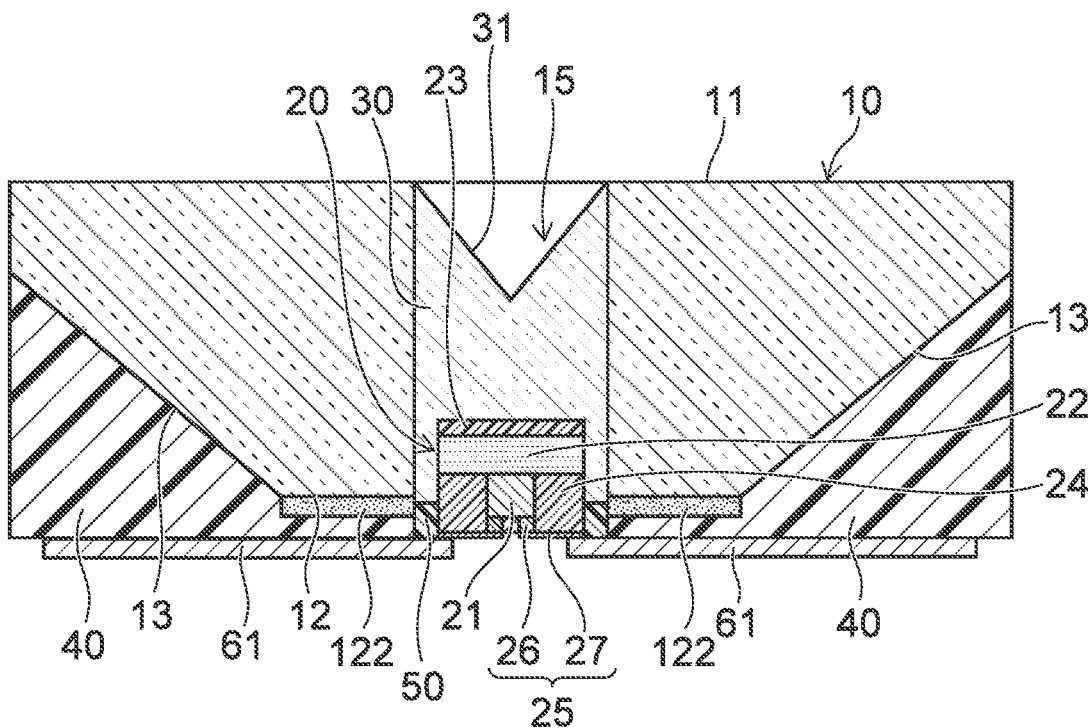
FIG. 16 is a schematic cross-sectional view of a light emitting module according to another embodiment of the present invention.

As shown in FIG. 16, a phosphor layer 122 may be disposed on the second face 12 of the light guide plate 10 in the periphery of the light emitting device 20. This allows the light whose wavelength has been converted by the phosphor layer 122 to be diffused by the light guide plate in a planar direction, thereby reducing color unevenness in the plane of the light guide plate 10.

Figure 17:
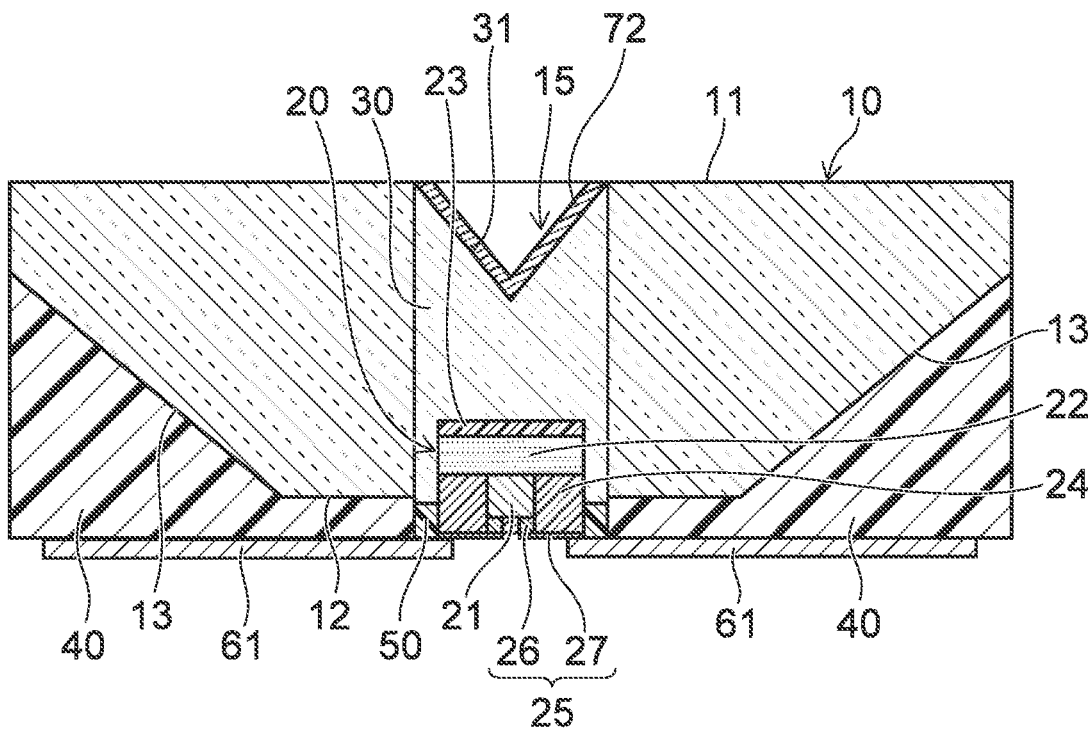
FIG. 17 is a schematic cross-sectional view of a light emitting module according to yet another embodiment of the present invention.

As shown in FIG. 17, a light reflecting member 72 may be disposed on the recessed part 31 having, for example, a V cross section, of the upper face of the light transmissive member 30. The light reflecting member 72 reflects a portion of the light emitted by the light emitting device 20 while transmitting another portion. This can prevent the area of the emission face of the light emitting module immediately above the light emitting device 20 from becoming excessively more luminous than the remaining area. Moreover, the presence of the light transmissive member 30 between the first light reflecting member 23 and the light reflecting member 72 can prevent the area immediately above the light emitting device 20 from becoming less luminous than the surrounding area.

Figure 18:
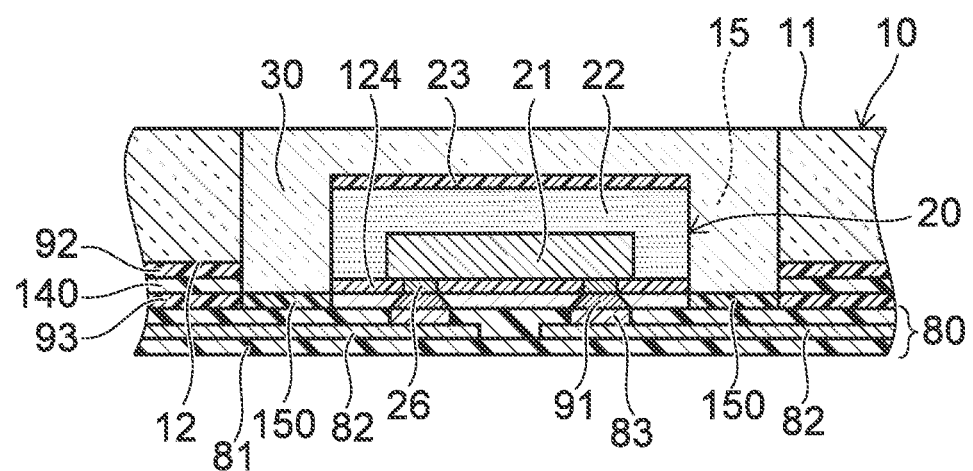
FIG. 18 is a schematic cross-sectional view of a light emitting module according to another embodiment of the present invention.

FIG. 18 is a schematic sectional view of a light emitting module according to another embodiment.

A fourth light reflecting member 140 is disposed on the second face 12 of the light guide plate 10 via an adhesive sheet 92. For example, an acrylic resin can be used for the adhesive sheet 92. For the fourth light reflecting member 140, for example, polyethylene terephthalate, which can be visually recognized as white by including a large number of air bubbles, can be used. The thickness of the fourth light reflecting member 140 is preferably 35 µm to 350 µm.

The lower face of the fourth light reflecting member 140 is bonded to a wiring substrate 80 via an adhesive sheet 93. The adhesive sheet 93 includes, for example, an acrylic resin. The wiring substrate 80 may comprise an insulating base 81, a wiring layer 82, and pads 83 connected to the wiring layer 82.

The light emitting device 20 may comprise a light emitting element 21, and a phosphor layer 22 covering the upper face and the lateral faces of the light emitting element 21. The light emitting device 20 is disposed in a through part 15. In the through part 15, a light transmissive member 30 is disposed on the light emitting device 20, and between the lateral faces of the light emitting device 20 and the lateral wall of the through part 15.

Between the upper face of the phosphor layer 22, which is the upper face of the light emitting device 20, and the light transmissive member 30, a first light reflecting member 23 is disposed. The first light reflecting member 23 is in contact with and covering the upper face of the light emitting device 20 (in this example, the upper face of the phosphor layer 22).

A light reflecting member 124 is disposed on the lower face of the light emitting element 21 and the lower face of the phosphor layer 22. A light reflecting member 150 is disposed on the surface of the wiring substrate 80 in the area surrounding the light emitting device 20 in the through part 15. The light reflecting member 124 and the light reflecting member 150 are, for example, a silicone or epoxy resin containing as a light reflecting material particles of $TiO_2$, $SiO_2$, $Al_2O_3$, $ZnO$, or the like.

The electrodes 26 of the light emitting element 21 are bonded to the pads 83 of the wiring substrate 80 via a bonding material 91 (e.g., solder).

Figure 19A:
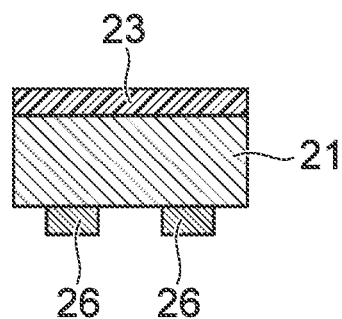
FIG. 19A is a schematic cross-sectional view of a light emitting device according to another embodiment of the present invention.

As a light source of the light emitting module, only a light emitting element can be used instead of the light emitting device using a light transmissive member such as the phosphor layer 22 as described above. As a light emitting device, as shown in FIG. 19A, one equipped with a light emitting element 21 and a first light reflecting member 23 can be used. In this case, the first light reflecting member 23 is disposed on the upper face of the light emitting element 21.

Figure 19B:
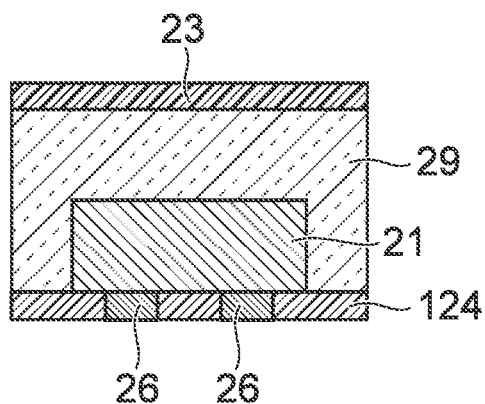
FIG. 19B is a schematic cross-sectional view of a light emitting device according to another embodiment of the present invention.

As shown in FIG. 19B, the light emitting device may be composed of a light emitting element 21, a light transmissive member 29 covering the upper face and the lateral faces of the light emitting element 21, and a light reflecting member 124 covering the lower face of the light emitting element 21 and the lower face of the light transmissive member 29. The light transmissive member 29 can be a phosphor layer containing a phosphor, or a layer not containing a phosphor. The first light reflecting member 23 is disposed on the upper face of the light transmissive member 29.

Figure 19C:
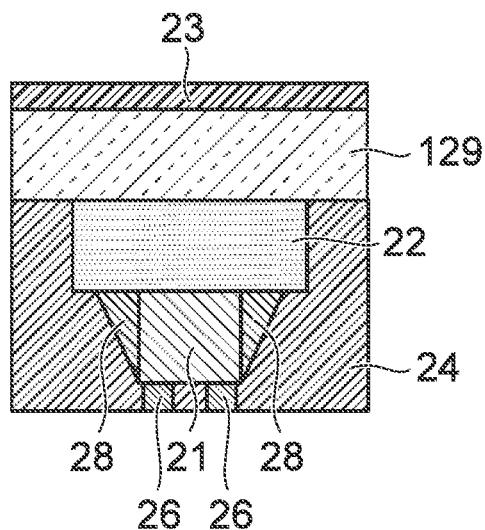
FIG. 19C is a schematic cross-sectional view of a light emitting device according to another embodiment of the present invention.

As shown in FIG. 19C, the light emitting device may be composed of a light emitting element 21, a phosphor layer 22, a light transmissive member 129 not containing a phosphor, and a light reflecting member 24. The phosphor layer 22 covers the upper face of the light emitting element 21. The light emitting element 21 is bonded to the phosphor layer 22 via an adhesive material 28. The light reflecting member 24 covers the lateral faces and the lower face of the light emitting element 21 and the lateral faces of the phosphor layer 22. The light transmissive member 129 is disposed on the upper face of the phosphor layer 22. The first light reflecting member 23 is disposed on the upper face of the light transmissive member 129.

In the case where the light emitting device includes no phosphor, a phosphor sheet may be disposed on the first face 11 of the light guide plate 10.

Figure 20:
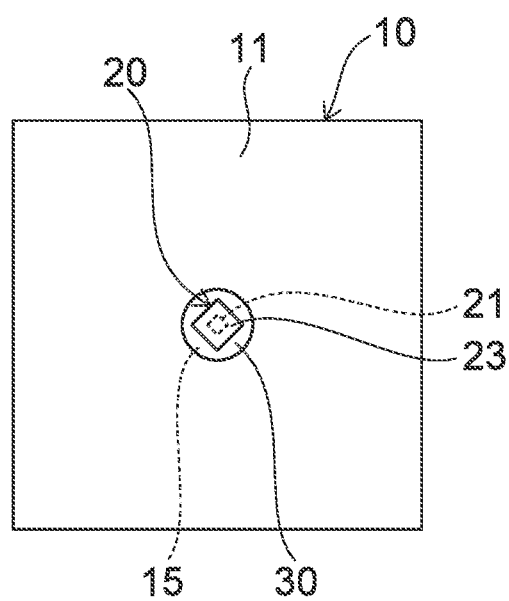
FIG. 20 is a schematic plan view of a light emitting module according to one embodiment of the present invention.

FIG. 20 is a schematic plan view of the emission face (the first face 11 of the light guide plate 10) of the light emitting module according to one embodiment. In the plan view, the first face 11 of the light guide plate 10 is formed to have a quadrilateral shape having four corners, and the light emitting device 20 is also formed to have a quadrilateral shape having four corners.

The light emitting device 20 which is quadrilateral in a plan view is placed while being rotated 45 degrees relative to the quadrilateral first face 11 of the light guide plate 10, where the diagonal lines connecting opposing corners of the first face 11 intersect with the lateral faces (sides) of the light emitting device 20. For example, in the case where the light guide plate 10 is a square, the corners of the light emitting device 20 are not positioned on the diagonal lines connecting opposing corners of the first face 11.

In the light emitting device 20 which is quadrilateral in a plan view, lateral faces have larger areas than the corners, and the luminance of the outgoing light from the lateral faces of the light emitting device 20 tends to be higher than the luminance of the light outgoing in diagonal directions.

Moreover, in the quadrilateral first face 11 of the light guide plate 10, the distance between the central part where the light emitting device 20 is positioned and a corner of the first face 11 is larger than the distance between the central part and a side of the first face 11. This tends not to easily diffuse light towards the four corners of the first face 11.

In accordance with the embodiment shown in FIG. 20, by positioning the light emitting device 20 relative to the light guide plate 10 such that the diagonal lines connecting corners of the first face 11 intersect with the lateral faces (sides) of the light emitting device 20, opposing the lateral faces of the light emitting device 20 to the corners of the first face 11, the outgoing light from the light emitting device 20 can easily be diffused to the four corners of the first face 11 of the light guide plate 10. Not being limited to this, using a light guide plate 10 which is quadrilateral in a plan view and a light emitting device 20 which is quadrilateral in a plan view, the light emitting device 20 may be placed such that one of the sides of the light guide plate 10 is in parallel with one of the sides of the light emitting device 20.

Figure 21:
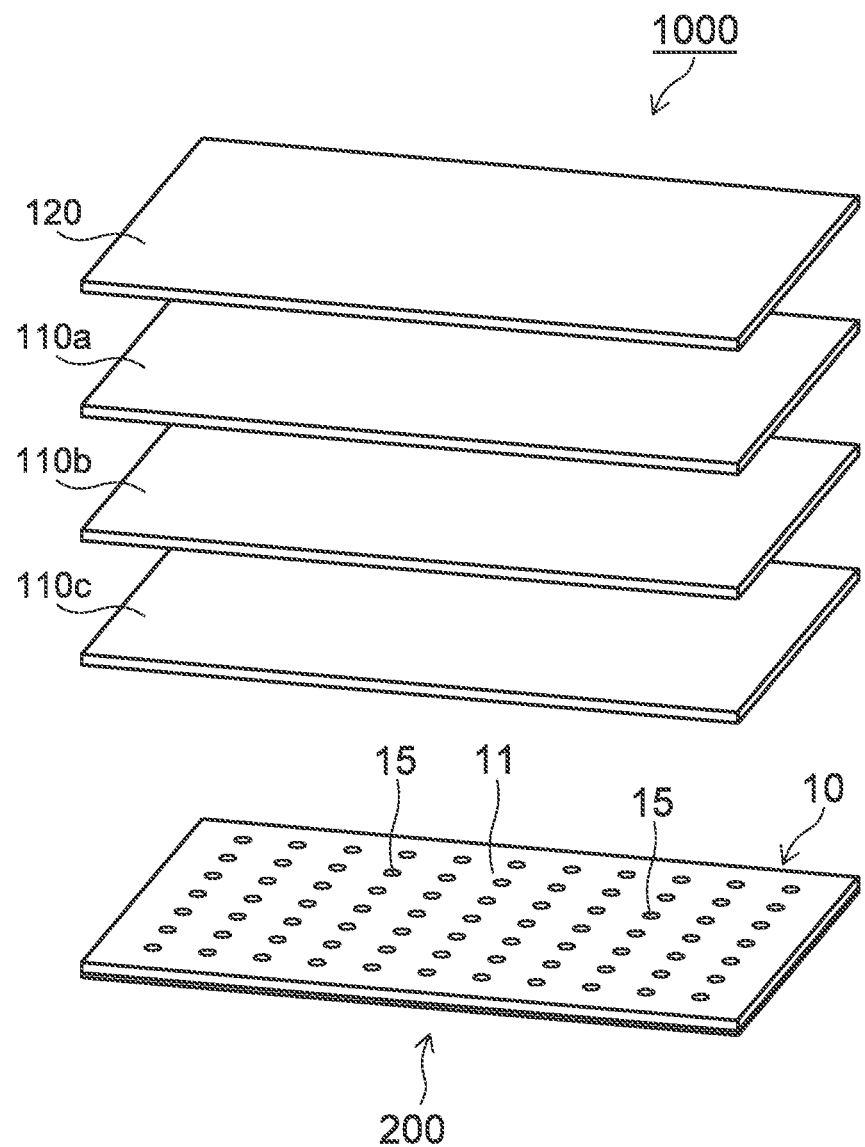
FIG. 21 is an exploded perspective view of a liquid crystal display according to one embodiment of the present invention.

FIG. 21 is an exploded perspective view of the structure of a liquid crystal display 1000 equipped with a light emitting module 200 according to one embodiment.

This liquid crystal display 1000 includes, successively from the top, a liquid crystal panel 120, two lens sheets 110a and 110b, a diffusion sheet 110c, and a light emitting module 200.

The light emitting module 200 may have the construction described earlier with reference to FIG. 1, FIG. 9, FIG. 11 to FIG. 20, or a combination of these. The light emitting module 200 includes a plurality of through parts 15 and a plurality of light emitting devices 20 arranged in the through parts 15.

The liquid crystal display 1000 is a so-called direct-lit liquid crystal display in which the light emitting module 200 functioning as a backlight is stacked under (behind) the liquid crystal panel 120. The liquid crystal display 1000 allows the light from the light emitting module 200 to irradiate the liquid crystal panel 120. The diffusion sheet 110c placed over the first face 11 which is the emission face of the light guide plate 10 can reduce luminance unevenness in the emission face. The liquid crystal display 1000 may include members, such as a polarizing film, color filter, and the like, in addition to those described above.

In the foregoing, certain embodiments of the present invention have been explained with reference to specific examples. The present invention, however, is not limited to these specific examples. All embodiments implementable by a person skilled in the art by suitably making design changes based on the those described above as the embodiments of the present invention also fall within the scope of the present invention so long as they encompass the subject matter of the present invention. Furthermore, various modifications and alterations within the spirit of the present invention that could have been made by a person skilled in the art are also considered as those falling within the scope of the present invention.

What is claimed is:

1. A method of manufacturing a light emitting module, the method comprising:
   forming a light reflecting member on a second face of a light guide plate which has a first face and the second face opposing the first face, and creating a through hole in the light guide plate penetrating between the first face and the second face so as to also penetrate the light reflecting member,
   adhering the second face of the light guide plate to a sheet so as to close the opening of the through hole on a second face side with the sheet,
   placing a light emitting device including electrode parts in the through hole and adhering the electrode parts to the sheet closing the opening of the through hole,
   forming a light transmissive member on the light emitting device in the through hole and between the light emitting device and a lateral wall of the through hole thereby fixing the light emitting device to the light guide plate using the light transmissive member, and
   separating the sheet from the light guide plate to which the light emitting device is fixed thereby exposing the electrode parts of the light emitting device on the second face side.

2. The method of manufacturing a light emitting module according to claim 1, wherein
   the process of forming a light transmissive member includes:
   a process of supplying a liquid resin containing a light reflecting material to the through hole,
   a process of settling the light reflecting material on the upper face of the light emitting device and the sheet where it closes the opening of the through hole, and
   a process of hardening the resin after settling the light reflecting material.

3. The method of manufacturing a light emitting module according to claim 1, further comprising creating a recessed part in the upper face of the light transmissive member.

4. A method of manufacturing a light emitting module, the method comprising:
   preparing a light guide plate comprising a first face, a second face opposing the first face, and a through hole penetrating between the first face and the second face,
   adhering the second face of the light guide plate to a sheet so as to close an opening of the through hole on a second face side,
   placing a light emitting device including electrode parts in the through hole and adhering the electrode parts to the sheet closing the opening of the through hole,
   forming a light transmissive member on the light emitting device in the through hole and between the light emitting device and a lateral wall of the through hole thereby fixing the light emitting device to the light guide plate using the light transmissive member, and
   separating the sheet from the light guide plate to which the light emitting device is fixed thereby exposing the electrode parts of the light emitting device on the second face side.

5. The method of manufacturing a light emitting module according to claim 4, wherein
   the process of forming a light transmissive member includes:
   a process of supplying a liquid resin containing a light reflecting material to the through hole,
   a process of settling the light reflecting material on the upper face of the light emitting device and the sheet where it closes the opening of the through hole, and
   a process of hardening the resin after settling the light reflecting material.

6. The method of manufacturing a light emitting module according to claim 4, further comprising creating a recessed part in the upper face of the light transmissive member.

* * * * *